(12) United States Patent
Hayasi

(10) Patent No.: US 7,732,896 B2
(45) Date of Patent: Jun. 8, 2010

(54) SEMICONDUCTOR APPARATUS AND METHOD OF MANUFACTURING THE SAME

(75) Inventor: Kouzi Hayasi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 160 days.

(21) Appl. No.: 11/480,428

(22) Filed: Jul. 5, 2006

(65) Prior Publication Data
US 2007/0013033 A1    Jan. 18, 2007

(30) Foreign Application Priority Data
Jul. 13, 2005    (JP)    ............................. 2005-203859

(51) Int. Cl.
*H01L 27/082*    (2006.01)
(52) U.S. Cl. .................... 257/580; 257/581; 257/582
(58) Field of Classification Search ................ 257/575, 257/359, 360, 380, 580–583
See application file for complete search history.

(56) References Cited

U.S. PATENT DOCUMENTS

| 6,225,867 | B1 * | 5/2001 | Ilowski et al. ............... 330/298 |
| 6,329,259 | B1 * | 12/2001 | Johansson ................... 438/315 |
| 6,717,188 | B2 * | 4/2004 | Aoki ............................ 257/191 |
| 2002/0186068 | A1 * | 12/2002 | Voldman et al. ............. 327/310 |
| 2003/0227071 | A1 * | 12/2003 | Chen ............................ 257/592 |
| 2004/0195644 | A1 * | 10/2004 | Mallikarjunaswamy et al. ............................ 257/491 |

FOREIGN PATENT DOCUMENTS

| JP | 2004-128142 | * | 4/2004 |
| JP | 2004128142 | * | 4/2004 |

OTHER PUBLICATIONS

Machine Translation of JP2004-128142.*
Machine translation of JP2004128142 is attached.*

* cited by examiner

*Primary Examiner*—Wai-Sing Louie
*Assistant Examiner*—Bilkis Jahan
(74) *Attorney, Agent, or Firm*—McGinn IP Law Group, PLLC

(57) ABSTRACT

A semiconductor apparatus comprises a plurality of transistor devices including a control terminal being inputted with a control signal and a first and a second terminals that a current flows therein according to the control signal, and a plurality of substrate conductive portions each formed in a region different from a region where the plurality of transistor devices are formed therein, wherein the transistor devices are connected to the substrate conductive portions, and each of the substrate conductive portion includes a semiconductor layer separated from other substrate conductive portions.

20 Claims, 14 Drawing Sheets

SEMICONDUCTOR APPARATUS AND METHOD OF MANUFACTURING THE SAME

BACKGROUND OF THE INVENTION

1. Field of the Invention

The present invention relates to a semiconductor apparatus and method of manufacturing the same. More particularly, the present invention relates to a structure of silicon bipolar junction transistor used for high frequency grounded emitter amplification and a structure of a silicon field effect transistor used for high frequency grounded source amplification, and a method of manufacturing the transistors.

2. Description of Related Art

To develop high frequency radio communication technology, it is essential for an amplifier technology used in communication devices to develop. An amplifier for high frequency radio communication is desired to further increase an output from communication wave of higher frequency range.

Semiconductor devices formed by compound semiconductor is used to amplifiers in a conventional high frequency radio communication technology. However to form a semiconductor device using compound semiconductor, expensive substrate material is needed with a complicated manufacturing process, thereby rising price of the semiconductor device formed by compound semiconductor. Accordingly an amplifier using semiconductor device formed of cheap silicon is required.

A technology to make a substrate conductive with an emitter as a BJT (Bipolar Junction Transistor) designed for high gain used in a conventional high frequency radio communication technology is disclosed (for example in Japanese Unexamined Patent Application Publication No. 2004-128142). FIG. 22 shows a plan layout view showing each electrode and line of a sub-emitter BJT 90 aiming for high gain according to a conventional technique. FIG. 23 is a cross-sectional diagram taken along the line XXIII-XXIII of FIG. 22 according to a conventional technique.

In the sub-emitter BJT 90, a high resistance p⁻ type epi 902 is formed on a low resistance p⁺ type substrate 901. In a device forming region inside the high resistance p⁻ type epi 902, a highly concentrated and low resistance n⁺ type buried layer 903 is formed to be a collector. A high resistance n⁻ type epi 904 is formed on the high resistance p⁻ type epi 902.

In regions other than the device forming region for the p⁻ type epi, a highly concentrated and low resistance p⁺ type buried layer 909 is mounted. A highly concentrated and low resistance p⁺ type sub-emitter layer 910 is mounted to the n⁻ type epi 904 above the p⁺ type buried layer 909. The p⁺ type buried layer 909 is formed to penetrate the p⁺ type epi 902. The p⁺ type sub-emitter layer 910 is formed to penetrate the n⁻ type epi 904.

Further, a p type base layer 905 is formed on the n⁻ type epi 904 above the n⁺ type buried layer 903. An n⁺ type emitter layer 907 is formed on the p type base layer 905. On the n⁻ type epi 904, an n⁺ type epi 908 collector layer with its bottom reaching to the n⁺ type buried layer 903 is formed.

A base electrode B, an emitter electrode E, and a collector electrode C are formed via openings provided in an insulator film 911 respectively on the p type base layer 905, the n⁺ type emitter layer 907, and the n⁺ type contact layer 908.

The emitter electrode E is connected with a sub-emitter electrode SE by an electrode line. The emitter electrode E is conductive with the low resistance p⁺ type substrate 901 via the sub-emitter electrode SE, a p⁺ type buried layer 909 and a p⁺ type sub-emitter layer 910. A metal layer 925 is deposited on a back side of the low resistance p⁺ type substrate 901.

A chip of the conventional sub-emitter BJT 90 arranged as described in the foregoing is mounted on an island of a lead frame using the metal layer 925 mentioned above as well as electrically connected with the island.

Although not shown in FIG. 17, a collector bonding pad CP and a base bonding pad BP shown in FIG. 18 are electrically connected to a lead of a lead frame by a bonding wire.

The sub-emitter BJT 90 formed as described in the foregoing is electrically connected to an emitter lead frame using the metal layer 925 on the back side of the chip, thereby not requiring the bonding wire to connect to the emitter lead. Therefore, an inductance caused by the bonding wire is completely eliminated, so that a high frequency power gain when amplifying grounded emitter (2 to 4 dB improvement in 0 to 8 GHz).

Further, in the sub-emitter BJT 90 of a conventional technique, as the low resistance p⁺ type sub-emitter layer 910 provided to the p⁻ type epi 902 and the n⁻ type epi 904 is placed below a bonding pad 924, the p⁺ type sub-emitter layer 910 is connected to ground via a back side of a chip.

It is therefore possible to suppress thermal noise generated due to resistance in the epi layer from entering into the base electrode through parasitic capacitance in an insulator film placed below the base bonding pad BP. Accordingly noise of the sub-emitter BJT can be reduced (i.e. The NF of the sub-emitter BJT can be reduced).

To attempt to increase an output of a semiconductor device using a high gain characteristic of a sub-emitter structure, unit devices in the sub-emitter structure are connected in parallel to form multi-cell so as to expand an emitter area. If each unit device behaves unequally, a thermal runaway could occur as the sub-emitter region is not separated by each unit device.

Further, in the BJT having a sub-emitter structure, a positive correlation exists between an emitter current and a device temperature. That is, if the temperature increases, the emitter current also increases, and if the emitter current increases, the temperature further increases, inducing a vicious cycle. Therefore, the devices may be destroyed due to the thermal runaway and it is impossible to have a stable high output operation with a structure in which unit devices of a sub-emitter structure being connected in parallel to form multi-cell.

SUMMARY OF THE INVENTION

According to an aspect of the present invention, there is provided a semiconductor device that includes a plurality of transistor devices comprising a control terminal inputted with a control signal and a first and a second terminals that a current flows therein according to the control signal, a plurality of substrate conductive portions each formed in a region different from a region where the plurality of transistor devices are formed therein, for providing conductivity to a substrate of the first terminal, wherein each of the plurality of substrate conductive portions include a semiconductor layer separated from other substrate conductive portions.

According to another aspect of the present invention, there is provided a method of manufacturing a semiconductor device that includes laminating a first semiconductor layer of a first conductivity type on a semiconductor substrate of the first conductivity type, forming a buried layer of a second conductivity type, which is different from the first conductivity type, on a first semiconductor layer, laminating a second semiconductor layer of the second conductivity type on the first semiconductor layer, forming a plurality of transistor devices comprising a control terminal inputted with a control signal and a first and a second terminals that a current flows therein according to the control signal, and forming a substrate conductive portion that makes the first terminal conductive with the semiconductor substrate on the second semiconductor layer to each of the plurality of the transistor devices.

According to a semiconductor device of this invention, by forming a substrate conductive portion that provides the first terminal (an emitter terminal for BJT, and a source terminal for FET) with conductivity to the substrate for each unit device, the substrate conductive portion is made to contain a function as a ballast resistor providing negative feedback against an increase of a current flowing to the first terminal. This prevents from all the cells behave equally and a phenomenon that lead to a thermal runaway due to a temperature rise of some cells, thereby enabling multi-cell devices to operate stably.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

An embodiment in which the present invention is applied thereto is described hereinafter in detail with reference to the drawings. In this embodiment, the present invention is applied to a silicon Bipolar Junction Transistor (BJT).

In a sub-emitter bipolar junction transistor (sub-emitter BJT) of this embodiment, by providing an isolation structure in a $p^+$ type sub-emitter region formed to a part of an $n^-$ epitaxial layer that is formed above a $p^+$ type substrate, the $p^+$ type sub-emitter region is made independent by each unit device. The sub-emitter BJT with a large emitter region is created by forming unit devices, which are provided each with $p^+$ type sub-emitter region, to be multi-cell. The sub-emitter region here is a semiconductor layer directly under an electrode (sub-emitter electrode) formed in a sub-emitter portion, and it is a substrate conductive portion from the emitter electrode to the substrate.

Figure 1:
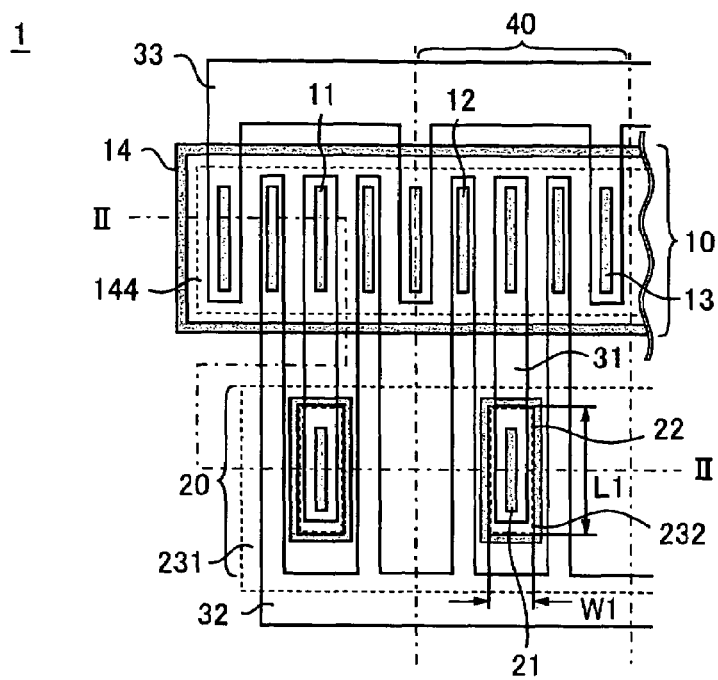
FIG. 1 is a plan layout view showing electrodes and lines of a sub-emitter BJT according to a first embodiment.
Figure 2:
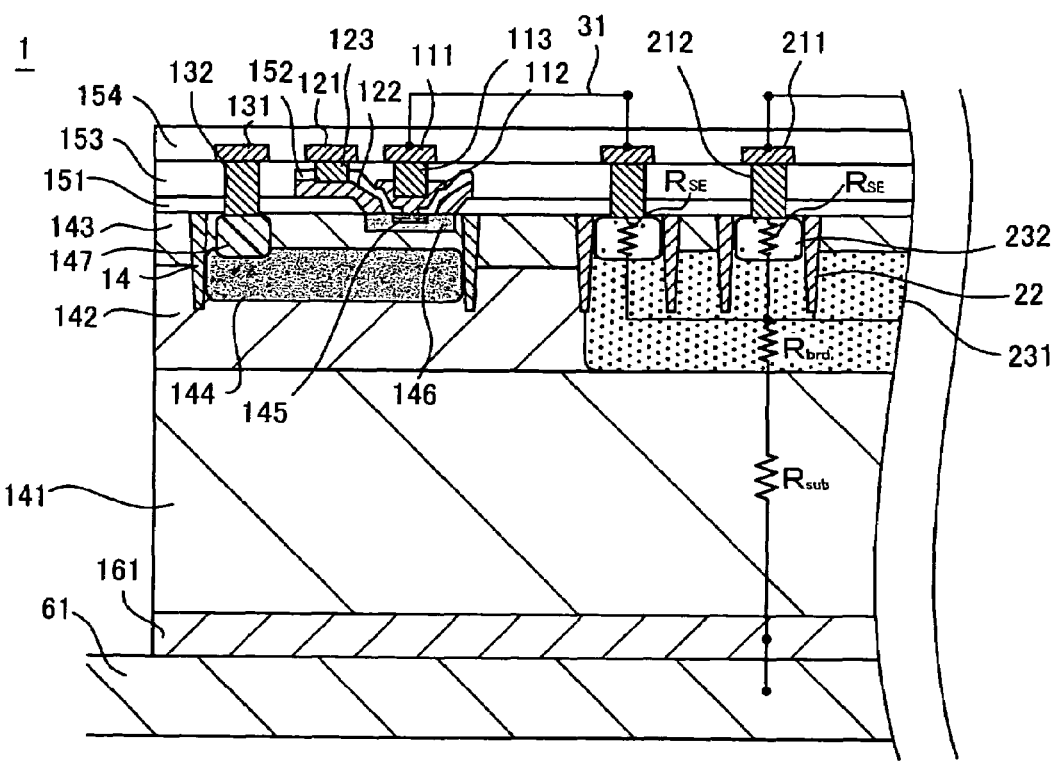
FIG. 2 is a cross-sectional diagram taken along the line II-II of FIG. 1.

FIG. 1 shows a plan layout view showing electrodes and lines of a sub-emitter BJT 1 according to this embodiment. FIG. 2 is a cross-sectional diagram taken along the line II-II of FIG. 1.

In the sub-emitter BJT 1 of this embodiment, a BJT device portion 10 and a sub-emitter portion 20 are formed on a chip. Emitter contact holes 11, base contact holes 12, and collector contact holes 13 are formed in the BJT device portion 10.

Below the holes, an emitter finger electrode 111, a base finger electrode 121, and a collector finger electrode 131 are formed that are shown in FIG. 2. Below the electrodes 111, 121, and 131, an $n^+$ type collector buried region 144 is formed. An region where the $n^+$ type collector buried region 144 is formed is referred to as a device forming region.

Further, a DTI (Deep Trench Isolation) 14 is formed around the emitter contact holes 11, the base contact holes 12, and the collector contact holes 13 in the BJT device portion. The DTI 14 is to separate the BJT device portion 10 from the sub-emitter portion 20.

Sub-emitter contact holes 21 are formed in the sub-emitter portion 20. A sub-emitter finger electrode 211 shown in FIG. 2 is formed below the sub-emitter contact holes 21. Further, p type sub-emitter regions 232 are formed under the sub-emitter finger electrode 211 as shown in FIG. 2.

In the sub-emitter BJT 1 of this embodiment, a DTI 22 is formed around the p type sub-emitter regions 232. As shown in FIG. 2, under the p type sub-emitter region 232, a p+ type sub-emitter buried region 231 is formed across an entire area of the sub-emitter portion 20. A region surrounded by alternate long and short dashed lines is a unit device 40.

The DTI 14 and the DTI 22 described in the foregoing are merely one method to form an isolation, and it can be achieved using other structures such as a guard ring structure formed with diffusion layer.

The sub-emitter BJT1 of this embodiment is described hereinafter in detail with reference to the cross-sectional diagram of FIG. 2. In the sub-emitter BJT 1 of this embodiment, a low concentrated and high resistance p⁻ type epi layer 142 is formed on the highly concentrated and low resistance p+ type substrate 141. In a device forming region in the p⁻ type epi layer 142, highly concentrated and low resistance n+ type collector buried region 144 is formed. A low concentrated and high resistance n⁻ type epi layer 142 is formed on the p⁻ type epi layer 142.

A p+ type base layer 146 is formed on the n⁻ type epi layer 143. An n+ type emitter region 145 is formed on the p+ type base layer 146. Further in the n⁻ type epi layer 143, An n+ type collector contact region 147 is formed with its bottom reaching to the n+ type collector buried region 144.

A base polysilicon 122 is formed on the p+ type base layer 146. The base polysilicon 122 is connected to the base finger electrode 121 via a metal plug for base 123. Similarly, an emitter polysilicon 112 is formed on the n+ type emitter region 145. The emitter polysilicon 112 is connected to the emitter finger electrode 111 via a metal plug for emitter 113.

The base polysilicon 122 and the emitter polysilicon 112 is separated by a second insulator film 152. Further, the emitter polysilicon 112 and the emitter finger electrode 111, and the base polysilicon 122 and the base finger electrode 121 are separated by a third insulator film 153. Furthermore, the base polysilicon 122 and the n⁻ type epi layer 143 are separated by the first insulator film 151.

The n+ type collector contact region 147 is connected to the collector finger electrode 131 via a metal plug for collector 132. The n+ type collector contact region 147 and the collector finger electrode 131 are separated by the first insulator film 151, a second insulator film 152, and the third insulator film 153.

In the BJT 1 of this embodiment, the device forming region, an region where the n+ type collector buried region 144 is formed thereto, is isolated by the DTI (Deep Trench Isolation) 24 provided to the p⁻ type epi layer 142 and the n⁻ type epi layer 143. The portion described above is the BJT device portion 10.

In the sub-emitter portion 20, the highly concentrated and low resistance p+ type sub-emitter buried region 231 with its bottom reaching to the p+ type substrate 141 is provided to the p⁻ type epi layer 142. The p type sub-emitter region 232 with its bottom reaching to the n+ type sub-emitter buried region 231 is provided to the n⁻ type epi layer 143, an upper part of the p+ type sub-emitter buried region 231.

The p type sub-emitter region 232 is connected to the sub-emitter finger electrode 211 via a metal plug for sub-emitter 212. The p type sub-emitter region 232 and the sub-emitter finger electrode 211 are separated by the first insulator film 151 and the third insulator film 153.

Further, the sub-emitter finger electrode 211 is connected to the emitter finger electrode 111 by an emitter electrode line 31. Accordingly the emitter finger electrode 111 is conductive with the p+ type substrate 141 via the sub-emitter finger electrode 211, the p type sub-emitter region 232, and the p+ type sub-emitter buried region 231. Further, on a back side of the p+ type substrate 141, backside electrode 161 is deposited.

Figure 3:
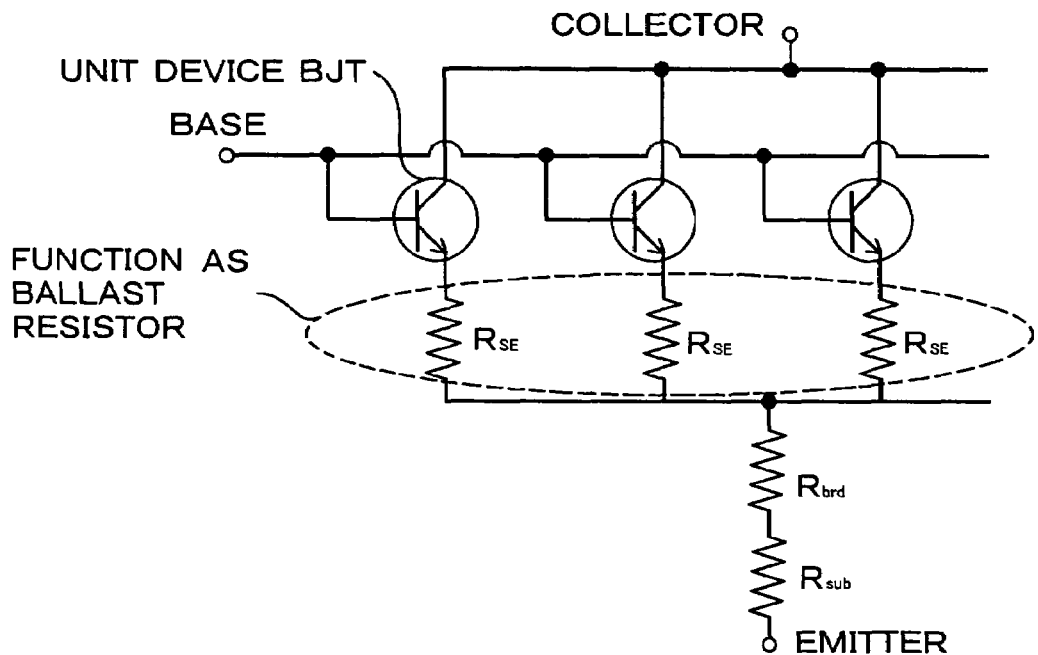
FIG. 3 is an equivalent circuit of a chip in which unit devices in a sub-emitter BJT of a first embodiment are formed to be multi-cell.

The BJT 1 of this embodiment further includes a DTI 22 to the side of the p type sub-emitter region 232. The DTI 22 separates the p type sub-emitter region 232 by each unit device. An equivalent circuit of a chip in which unit devices of the BJT created to form multi-cell as described in the foregoing is shown in FIG. 3.

Separating the p type sub-emitter region 232 by unit device increases a resistance of the p type sub-emitter region 232 for each unit device. It means that the p type sub-emitter region 232 can be used as not only an emitter conductive unit from a chip surface to the p+ type substrate 141 but also an emitter ballast resistor.

If the p type sub-emitter region 232 is used as an emitter ballast resistor, it is possible to apply negative feedback to reduce a voltage between a base and an emitter when an emitter current increases, thereby enabling to suppress an increase of the emitter current induced by heat.

To be more specific, as the p type sub-emitter region 232 works to cancel out an unbalanced behavior between each unit device in multi-cell devices, it is possible to control that each unit device in the multi-cell devices to behave equally. This corresponds to a resistance of the p type sub-emitter region 232 for each unit device performing as a ballast resistor to enable a stable operation of multi-cell devices.

Further, in the BJT 1 of this embodiment, when requiring a ballast resistor with a large resistance value, a resistance can be increased instead of increasing a level of concentration for impurity doped to the p type sub-emitter region 232. This expands a role of the p type sub-emitter region 232 as an emitter ballast resistor.

Figure 4:
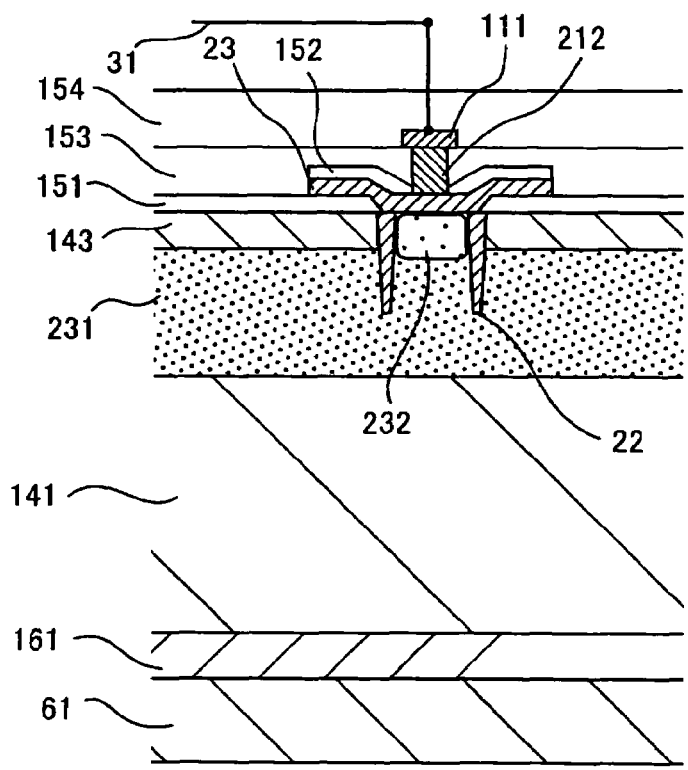
FIG. 4 shows a sub-emitter portion where a sub-emitter polysilicon is provided between a p type sub-emitter region and a metal plug for sub-emitter.

As shown in FIG. 4, it is desirable to the metal plug for sub-emitter 212 is buried on the sub-emitter polysilicon 213 that is on the p type sub-emitter region 232. This is because that good ohmic contact may not be obtained if directly connecting the metal plug for sub-emitter 212 with a surface of the p type sub-emitter region 232.

On the other hand by connecting the metal plug for sub-emitter 212 with the surface of the p type sub-emitter region 232 via the sub-emitter polysilicon 23, p type impurity (for example boron) doped to the sub-emitter polysilicon 23 is diffused to the surface of the p type sub-emitter region 232, accordingly assuring a good Ohmic contact.

A resistance of the p type sub-emitter region 232 being separated by each unit device is described hereinafter in detail using an example. A resistance $R_{se}$ by the p type sub-emitter region 232, a resistance $R_{brd}$ by the p+ type sub-emitter buried region 231, and a resistance $R_{sub}$ by the p+ type substrate 141 are calculated hereinafter. Suppose a depth of the p type sub-emitter region 232 $t_1=1$ μm, a resistivity $p_1=0.06$ Ωcm (equivalent to a concentration of p type impurity $1\times10^{18}$ cm$^{-3}$), a size of flat shape $W_q=2$ μm, $L_1=12$ μm (see FIG. 1). $R_{se}$ can be calculated as:

$$R_{SE} = \rho \frac{t_1}{L_1 W_1} = 25\Omega \qquad \text{(Numerical Expression 1)}$$

For a resistance of the p type sub-emitter region 232 described in the foregoing, assume that an emitter current of 4 mA flows to unit devices, and the emitter current increases by 10% by heat. Then a voltage between base and emitter is applied with negative feedback to decrease by 0.4 mA×25 Ω=10 mV.

A resistance $R_{brd}$ of the $p^+$ type sub-emitter buried region 231 is calculated hereinafter. Suppose that a depth of the $p^+$ type sub-emitter region 231 $t_2$=5 μm, a resistivity $p_2$=0.06 Ωcm (equivalent to a concentration of p type impurity $1\times10^{18}$ $cm^{-3}$), a size of flat shape $W_2$=400 μm, and $L_2$=40 μm. The $R_{brd}$ in this case is calculated as:

$$R_{SE} = \rho_2 \frac{t_2}{L_2 W_2} = 0.19\Omega \quad \text{(Numerical Expression 2)}$$

Further, a resistance $R_{sub}$ of the $p^+$ type sub-emitter substrate 141 is calculated hereinafter. Suppose that a depth of the $p^+$ type substrate 141 $t_3$=150 μm, a resistivity $p_2$=0.05 Ωcm (equivalent to a concentration of p type impurity $1\times10^{18}$ $cm^{-3}$). As an approximation generally used to calculate substrate resistance, a parallelepiped having an electric waveguide to a base of a rectangle is used. Suppose that a parallelepiped from a base of the $p^+$ type sub-emitter buried area 231 to a back side of the chip is an electric wave guide (assume that an angle of divergence is 45 degree to a perpendicular line). At this time, $R_{sub}$ can be calculated as:

$$R_{sub} = \frac{\rho_3 t_3}{W_2 L_2} \frac{\ln\frac{w}{l}}{w-1} = 0.11\Omega \quad \text{(Numerical Expression 3)}$$

$$w \equiv \frac{W_2 + 2t_3}{W_2}$$

$$l \equiv \frac{L_2 + 2t_3}{L_2}$$

As described in the foregoing, as the resistance $R_{brd}$ of the $p^+$ type sub-emitter buried region 231 and the resistance $R_{sub}$ of the $p^+$ type substrate 141 are extremely low resistance, effect as a ballast resistance is greatly reduced as well. Further a gain reduction by $R_{brd}$ and $R_{sub}$ is extremely small as well. This clarifies that the p type sub-emitter region 232 separated by each unit device has a major role playing as a ballast resistor.

Further in this embodiment, a transistor chip is created by forming unit devices to be multi-cell. Forming multi-cell keeps an emitter area of each unit devices to be appropriate size as well as enables to create an emitter region capable of flowing a high current.

In a chip of the BJT according to this embodiment, by separating a sub-emitter region by each unit device, it is possible for all the cells to behave equally and to suppress a phenomenon of a thermal runaway induced by some cells increasing their temperature. It also enables to create a BJT chip capable of stable and high output. For example in a BJT chip comprising 120 cells of unit devices having a cut off frequency $f_T$ and emitter size 0.3 μm×20 μm, stable output at approximately 2 W can be obtained.

Figure 5:
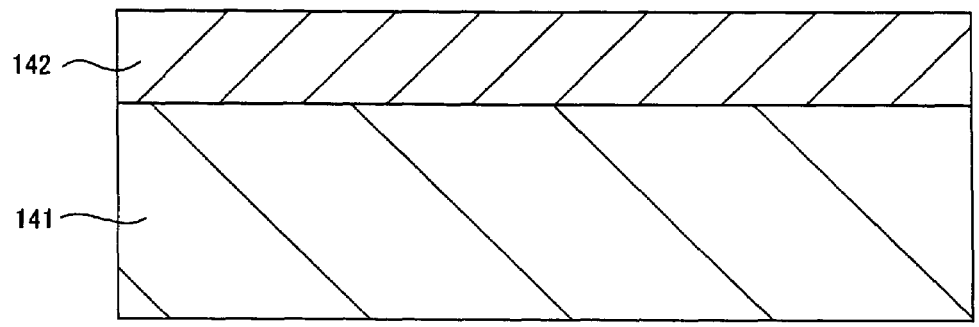
FIG. 5 is a first cross-sectional diagram showing steps of manufacturing a sub-emitter BJT in order according the first embodiment.

A manufacturing method of the sub-emitter BJT 1 of this embodiment is described hereinafter in detail. Firstly as shown in FIG. 5, grow a $p^-$ type epi layer 142 on a $p^+$ type substrate 141. The $p^+$ type substrate 141 is for example has a specific electric resistance p=0.01 to 0.1 Ωcm. The $p^-$ type epi layer 142 is added with boron and formed to have a specific resistance p=5 to 30 Ωcm, and a width 2 to 15 μm.

Figure 6:
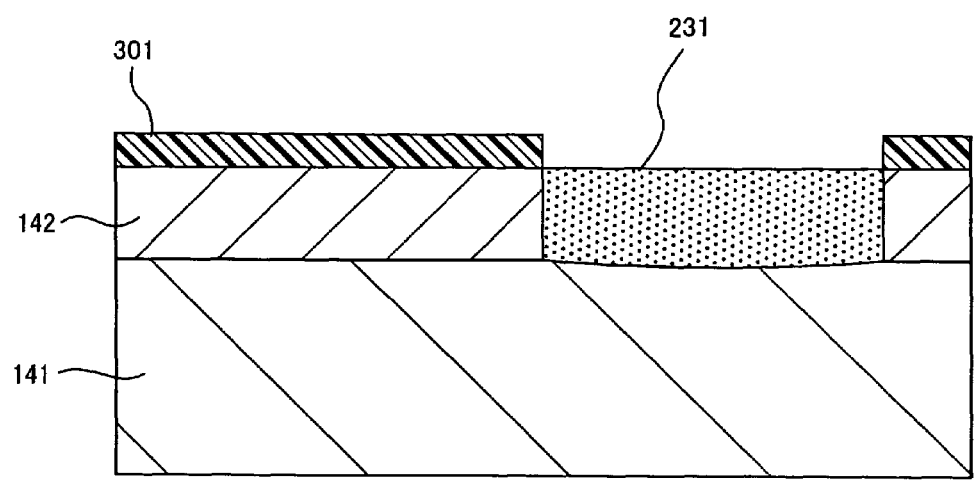
FIG. 6 is a second cross-sectional diagram showing steps of manufacturing a sub-emitter BJT in order according the first embodiment.

Then as in FIG. 6, apply photoregist on a surface of the $p^-$ type epi layer 142 to form a resist pattern 301 with an opening for a region of a sub-emitter portion 20. Using the resist pattern 301, dope the $p^-$ type epi layer 14 with boron by ion implantation, and apply a heat treatment at more than 1100 degrees so as to form a $p^+$ type sub-emitter buried region 231 with its bottom reaching to the $p^+$ type substrate 141. A concentration of boron is for example $1\times10^{18}$ $cm^{-3}$.

Figure 7:
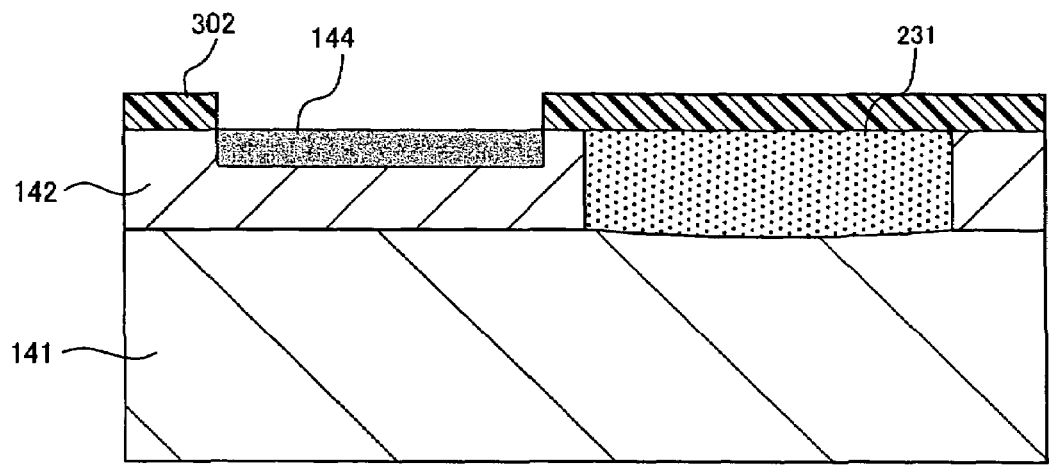
FIG. 7 is a third cross-sectional diagram showing steps of manufacturing a sub-emitter BJT in order according the first embodiment.

Then remove the resist pattern 301, and as shown in FIG. 7, apply photoresist again to the surface of $p^+$ type epi layer 142 to form a resist pattern 302 with an opening for a device forming region. After that, dope the $p^-$ type epi layer 143 with arsenic (As) by ion implantation using the resist pattern 302 to form an $n^+$ type collector buried layer 144 with a sheet resistance $\rho_s$=10 to 30 Ω/□.

Figure 8:
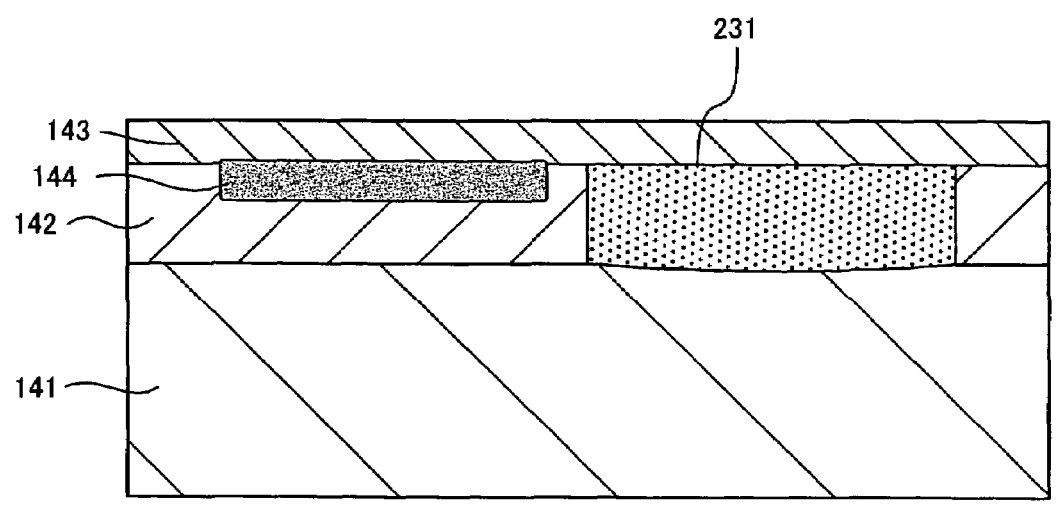
FIG. 8 is a fourth cross-sectional diagram showing steps of manufacturing a sub-emitter BJT in order according the first embodiment.

Further, as shown in FIG. 8, grow an $n^-$ type epi layer 143 on the $p^-$ type epi layer 142. The $n^-$ type epi layer 143 is added with phosphorous (P) and formed to have a specific resistance ρ=0.5 to 4 Ωcm and a thickness 0.5 to 5 μm.

Figure 9:
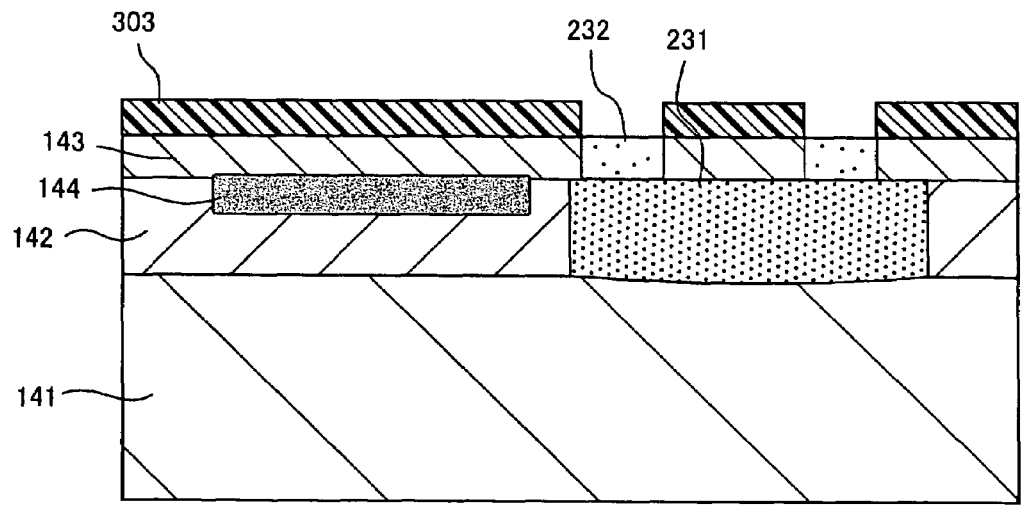
FIG. 9 is a fifth cross-sectional diagram showing steps of manufacturing a sub-emitter BJT in order according the first embodiment.

Then as shown in FIG. 9, apply photoresist on the surface of the $n^-$ type epi layer 143 to form a resist pattern 303 with openings on the $p^+$ type sub-emitter buried region 231. Using the resist pattern 303, dope the $n^-$ type epi layer 143 with boron by ion implantation, apply a heat treatment at more than 900 degrees C. to form a p type sub-emitter region 232 with its bottom reaching to the $p^+$ type sub-emitter buried region 231. A concentration of boron is for example $1\times10^{18}$ $cm^{-3}$.

Figure 10:
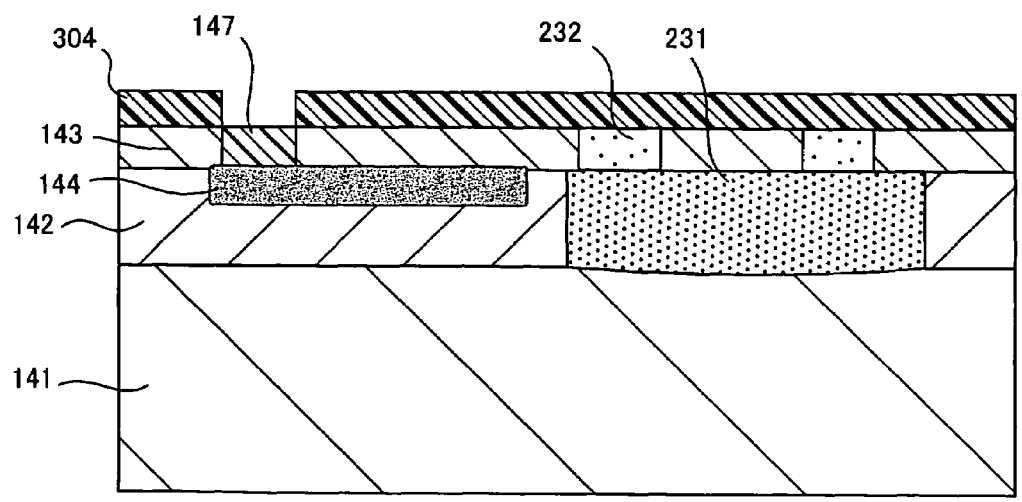
FIG. 10 is a sixth cross-sectional diagram showing steps of manufacturing a sub-emitter BJT in order according the first embodiment.

Then remove the resist pattern, apply photoresist on the surface of the $n^-$ type epi layer 143 as shown in FIG. 10 to form a resist pattern 304 with an opening on the $n^+$ type collector contact region 147. Using the resist pattern 304, dope the $n^-$ type epi layer 143 with phosphorous by ion implantation, apply a heat treatment to form the $n^+$ type collector contact region 147 with its bottom reaching to the $n^+$ type collector buried layer 144. A specific resistance of the $n^+$ type collector contact region 147 is about the same level as that of the $n^+$ type collector buried layer 144.

Then as shown in FIG. 1, form a resist pattern with openings for the DTIs 22 and 24. By photolithography technology using this resist pattern, perform a selective etching to the $n^-$ type epi layer 143 and the $p^-$ type epi layer 143 so as to create a trench structure. Burying silicon oxide in this trench structure produces the DTIs 22 and 24.

Figure 11:
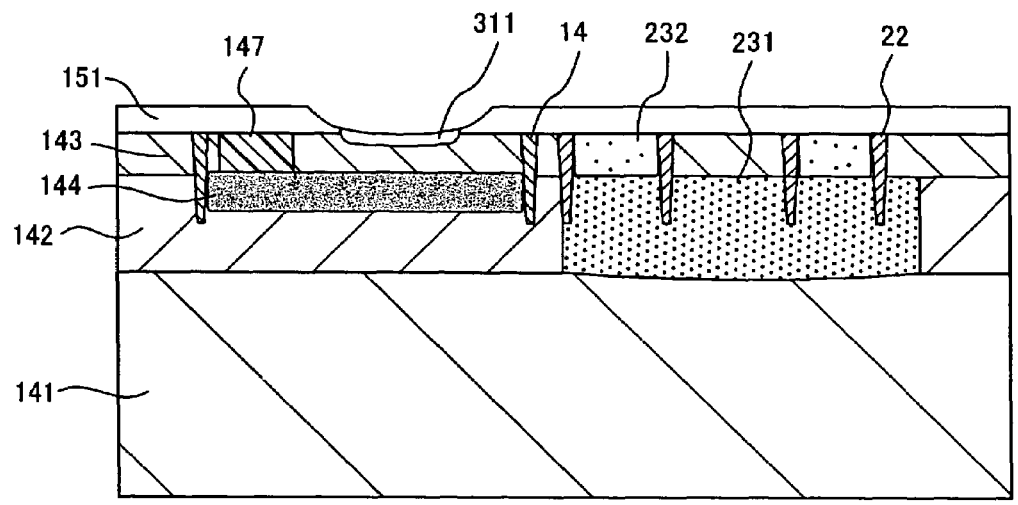
FIG. 11 is a seventh cross-sectional diagram showing steps of manufacturing a sub-emitter BJT in order according the first embodiment.

Then as shown in FIG. 11, form a first insulator film 151 on a surface of the $n^-$ type epi layer 143, for example by thermal oxidation method or CVD method. On a surface of the first insulator film 151, form a resist pattern 305 with an opening for a base forming region. With photolithography using this resist pattern, perform a selective etching to the first insulator film 151. At this time, shallowly etch the surface of the base forming region of the $n^-$ type epi layer 143. Then form a thin oxide film 311 in the opened region by thermal oxidation.

Figure 12:
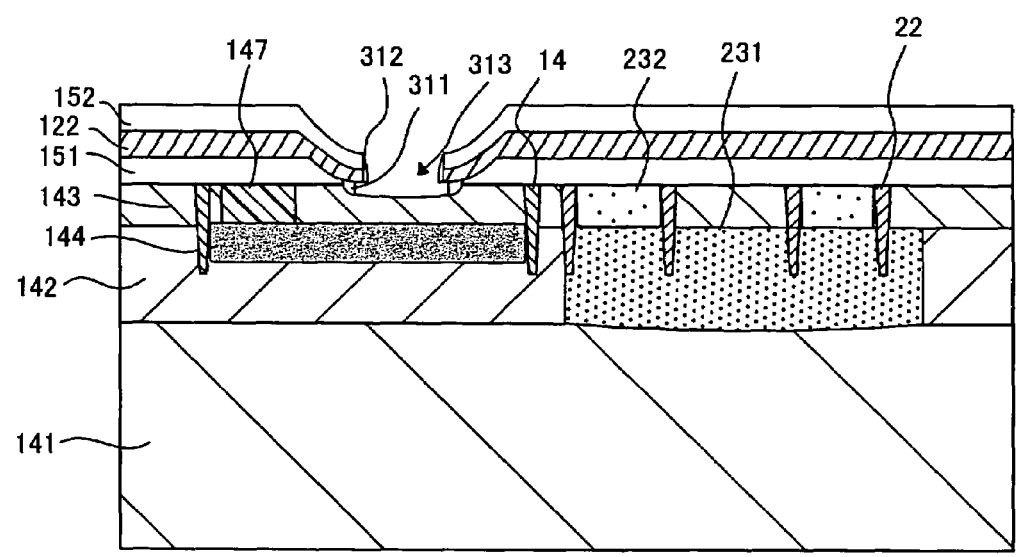
FIG. 12 is an eighth cross-sectional diagram showing steps of manufacturing a sub-emitter BJT in order according the first embodiment.

After that as shown in FIG. 12, form a base polysilicon 122 added with boron having a desired thickness on the first insulator film 151 and the thin oxide film 311. Then, laminate a second insulator film 152 on the base polysilicon 122. With photolithography technology using a resist pattern with an opening narrower than the opening of the resist pattern 305, perform a selective etching to the second insulator film 152 and the base polysilicon 122 to create an opening.

After that, grow an insulator film over an entire surface and perform an anisotropic etching to the insulator film so as to form a first side wall 312 leaving the insulator film only on internal surface of an opening in the second insulator film and also to coat an end of the base polysilicon 122 with the insulator film. Then, etch the thin silicon oxide film 311 to form a concave portion 313. At this time, the thin oxide silicon film 311 is etched to a wider area than where the base polysilicon 122 is opened thereto, thus the concave portion 313 is formed in a wider area than the first side wall 312, as shown in FIG. 12.

Figure 13:
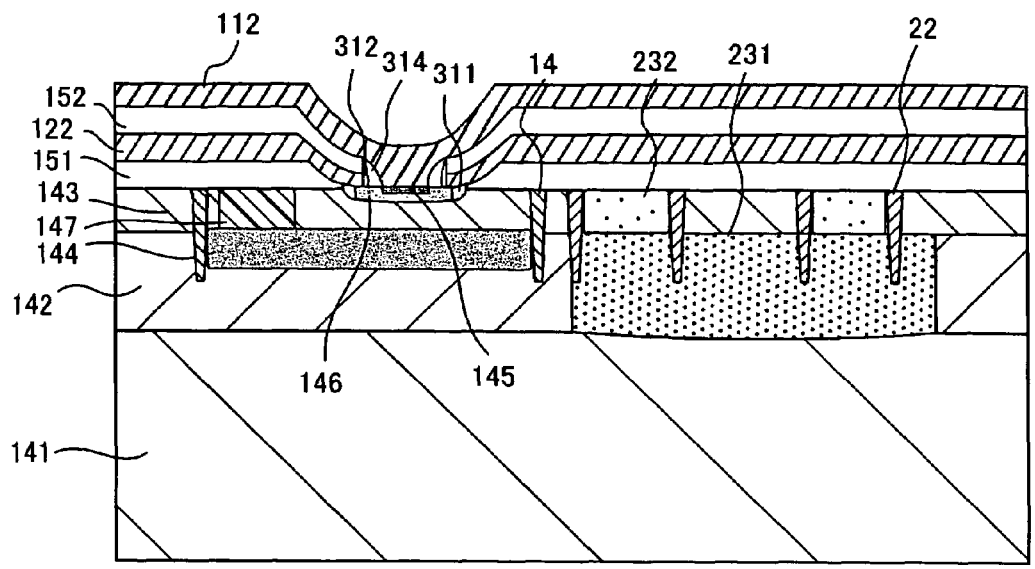
FIG. 13 is a ninth cross-sectional diagram showing steps of manufacturing a sub-emitter BJT in order according the first embodiment.

After that as shown in FIG. 13, perform a selective epitaxial growth of SiGe, which is added with boron, on the n⁻ type epi layer 143 exposed to a base of the concave portion 313 to form the p⁺ type base layer 146 being integrated with the n⁻ type epi layer 143. As the p⁺ type base layer 146 is formed in the concave portion 313 opening up to a wider area, the base polysilicon 122 and the p⁺ type base layer 146 are connected.

Further, grow an insulator film on an entire surface and apply an anisotropic etching to the insulator film to form a second side wall 314 on an inner side of the first side wall 315 and to narrow the opening. After forming the emitter polysilicon 112, implant arsenic in the emitter polysilicon 112. The implanted arsenic is implanted to the p⁺ type base layer 146 to form the n⁺ type emitter layer 145.

Figure 14:
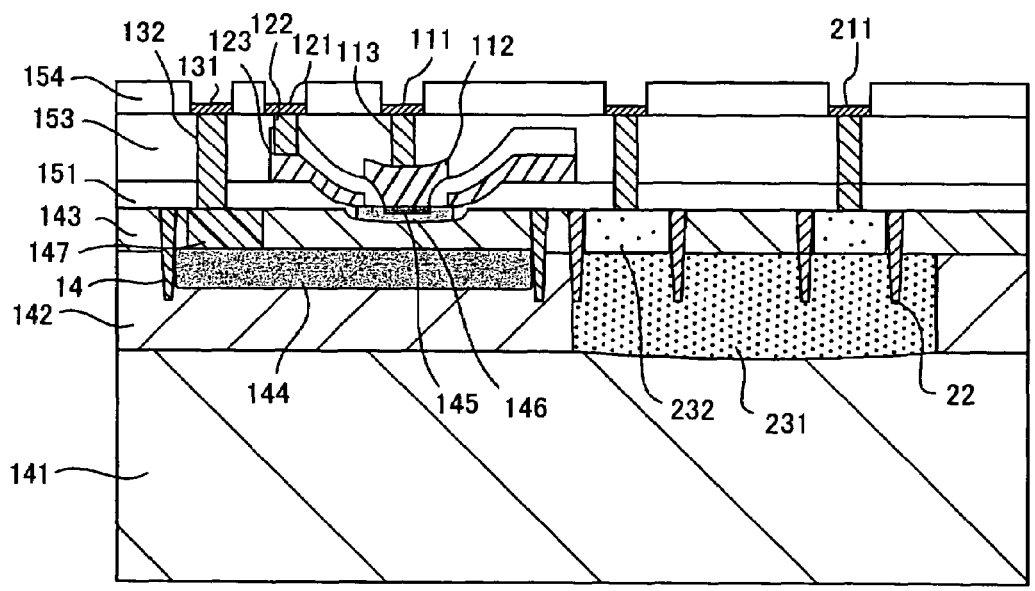
FIG. 14 is a tenth cross-sectional diagram showing steps of manufacturing a sub-emitter BJT in order according the first embodiment.

After that, with photolithography technology as shown in FIG. 14, perform a selective etching to the emitter polysilicon 112 so as to leave the emitter polysilicon 112 to an area covering the opening of the second insulator film 152 and the side wall 314. Further, with photolithography technology, perform a selective etching to the second insulator film 152 and the base polysilicon 122. Then form a third insulator film 153 made of silicon oxide film over an entire surface by CVD method.

Further, form a resist pattern with openings on the n+ type collector contact region 147, the base polysilicon 122, the emitter polysilicon 112, and the p type sub-emitter region 232. With photolithography technology using this resist pattern, perform a selective etching to the second insulator film 152 and the third insulator film 153 so as to form openings. After that, form a base metal plug 123, a collector metal plug 132, and a sub-emitter metal plug 212 by depositing metal.

Then, remove the resist pattern, and form the collector finger electrode 132, a base finger electrode 123, and an emitter finger electrode 113, and a sub-emitter finger electrode 211 on the emitter metal plug 113, the base metal plug 123, the collector metal plug 132, and a sub-emitter metal plug 212. After that, form a fourth insulator film 154 to flatten the surface.

Then as shown in FIG. 1, open a collector contact hole 13, a base contact hole 12, an emitter contact hole 11, and a sub-emitter contact hole 21 to expose the collector finger electrode 132, the base finger electrode 123, an emitter finger electrode 113, and the sub-emitter finger electrode 211 in the fourth insulator film 154. Then as shown in FIG. 1, connect the contact holes each other with electrode lines using a method described hereinafter.

Figure 15:
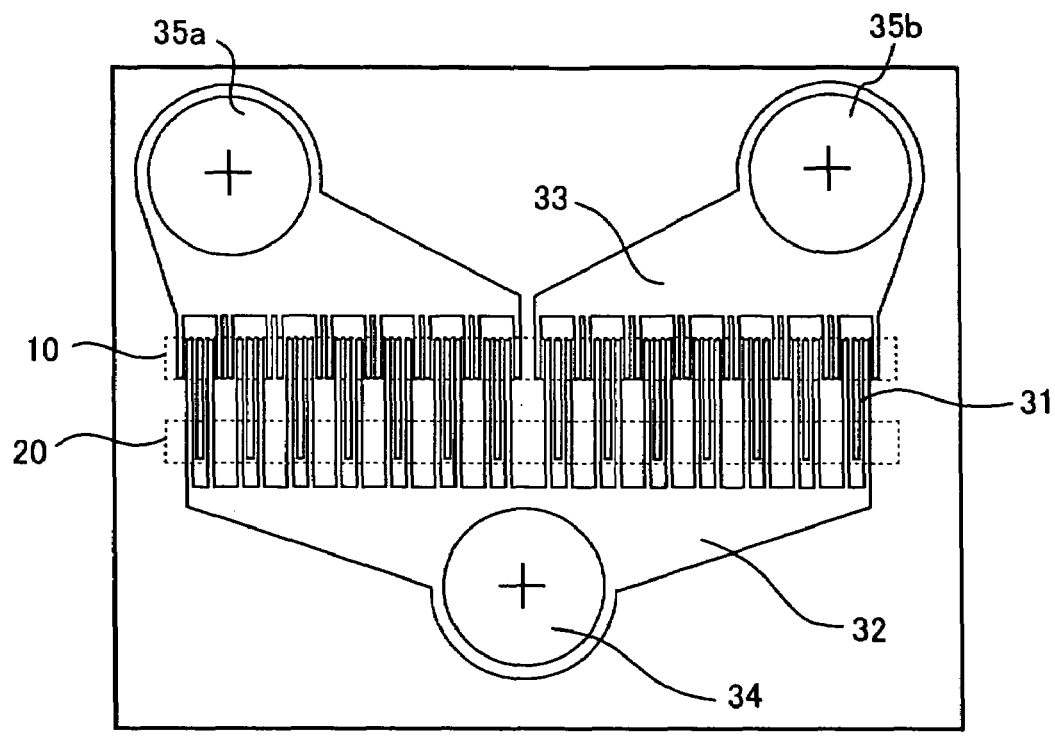
FIG. 15 is an example of schematic diagram of a transistor chip in which unit devices are formed to be multi-cell.

FIG. 15 shows an example of a schematic diagram showing a transistor chip 50 created by forming unit devices into multi-cell. A base electrode line 32 and a collector electrode line 33 of unit devices being formed to be multi-cell are integrated. The base electrode lien 32 is connected to a base bonding pad 34, and the collector electrode line 33 is connected to collector bonding pads 35a and 35b. Although two collector bonding pads and one base bonding pad are illustrated in the FIG. 15, the number of the bonding pads is not restricted to this but may be changed as appropriate.

Figure 16:
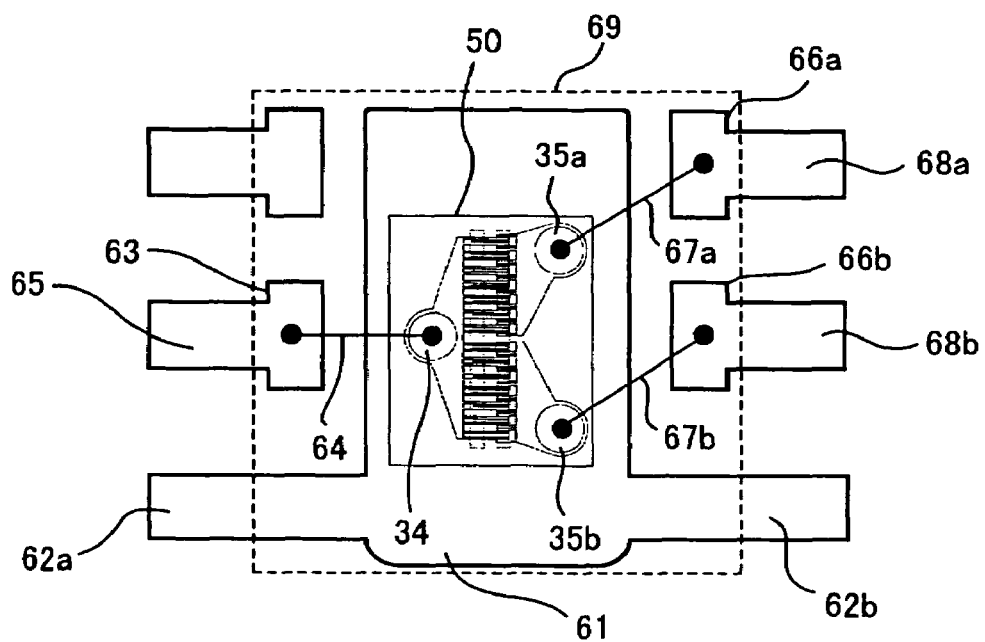
FIG. 16 is a view in which a transistor chip is mounted to a package.

FIG. 16 is a view showing a package that the transistor chip 50 is mounted thereto. The transistor chip 50 is mounted to a emitter lead frame 61. At this time, a rear electrode placed on a back side of the transistor chip 50 is electrically connected to the emitter lead frame 61. This creates emitter terminals 62a and 62b.

The base bonding pad 34 is connected to the base lead frame 63 by the base bonding wire 64 to create the base terminal 65. Similarly, the collector bonding pad 35a is connected to a collector lead frame 66a by a collector bonding wire 67a, thereby creating a collector terminal 68a, and the collector bonding pad 35b is connected to a collector lead frame 66b by a collector bonding wire 67b, thereby creating a collector terminal 68b. Further, enclose the entire chip with mold resin 69 to complete as product.

With the manufacturing method described above, it is possible to manufacture at the same cost as a conventional structure because a process can be the same as the process for manufacturing a wafer for a BJT chip of a conventional technique.

In the semiconductor device described above, although active devices are self-aligned type, and npn type SiGe selective epitaxial base Hetero Bipolar Transistor (HBT), the active devices are not restricted to this. For example it can be blanket type SiGe overgrowth epitaxial base HBT, a self-aligned type ion implantation base Si-BJT, or a non-self-aligned type ion implantation base Si-BJT.

Further, the active devices can be of pnp type, not npn type. It can be used to FET, not BJT. In that case, emitter is converted to a source, a base is converted to a gate, and a collector is converted to a drain.

Second Embodiment

Figure 17:
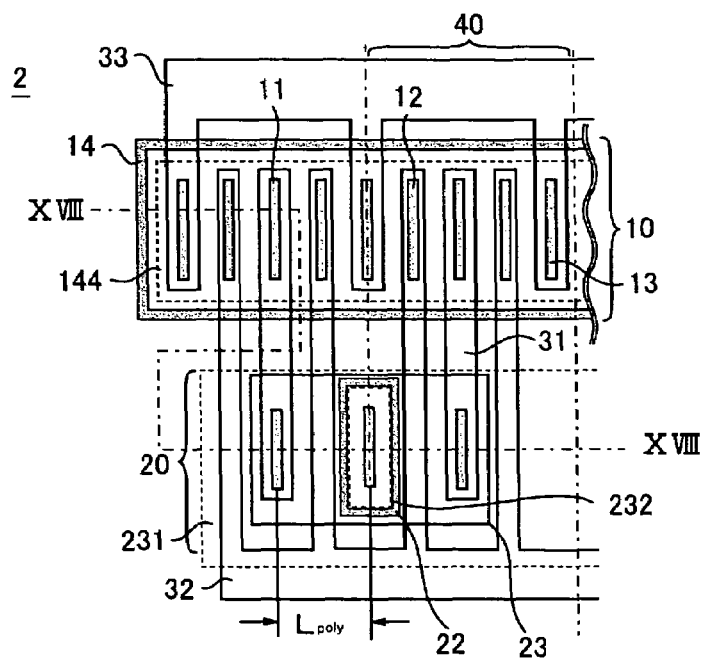
FIG. 17 is a plan layout view showing each electrode and line of the sub-emitter BJT according to a second embodiment.
Figure 18:
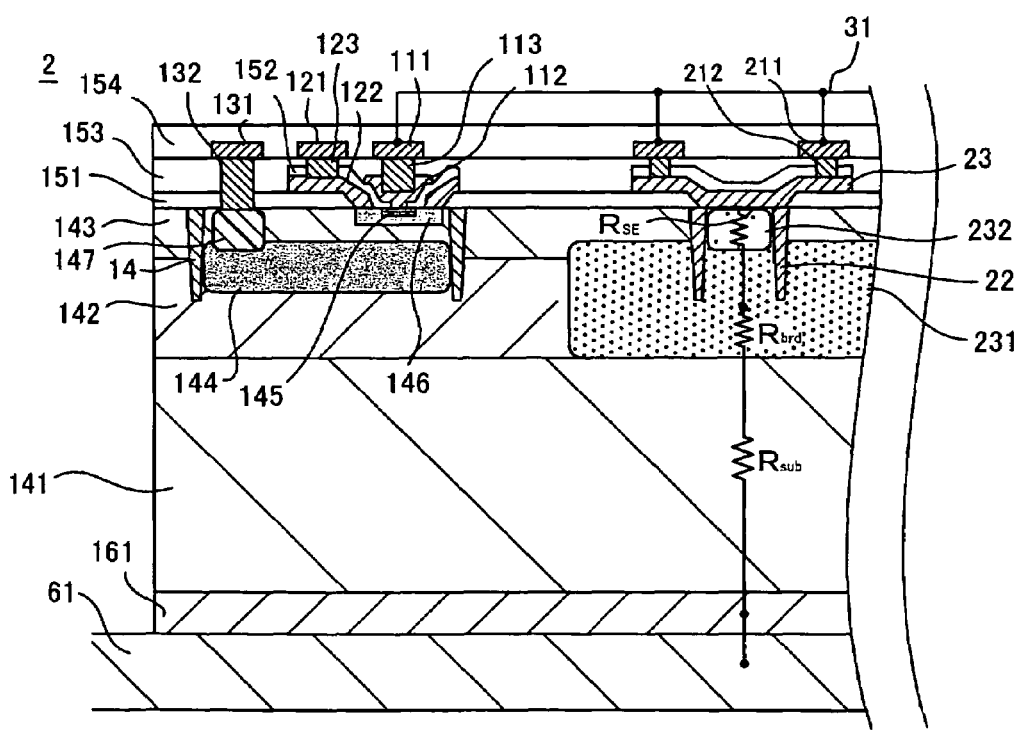
FIG. 18 is a cross-sectional diagram along with the line XVIII-XVIII of FIG. 17.

A sub-emitter BJT 2 of a second embodiment uses the sub-emitter polysilicon 23 between the sub-emitter region 232 and a sub-emitter electrode. The sub-emitter polysilicon 23 performs as a ballast resistor by forming the sub-emitter polysilicon 23 extending towards horizontal direction to lengthen a distance where an emitter current flows, thereby increasing resistance. A plan view of the sub-emitter BJT 2 of this embodiment is shown in FIG. 17. FIG. 18 is a cross-sectional diagram taken along the line XVIII-XVIII of FIG. 17. In FIGS. 17 and 18, components and principle of operations identical to those in the first embodiment are omitted.

A structure of the sub-emitter BJT 2 of this embodiment includes an emitter current horizontally flows for a length of $L_{poly}$ in the sub-emitter polysilicon 23. The sub-emitter polysilicon 23 therefore includes a resistance $R_{poly}$. Further in the sub-emitter BJT 2, the p type sub-emitter region 232 is separated by each device for the devices to perform as ballast resistances.

Figure 19:
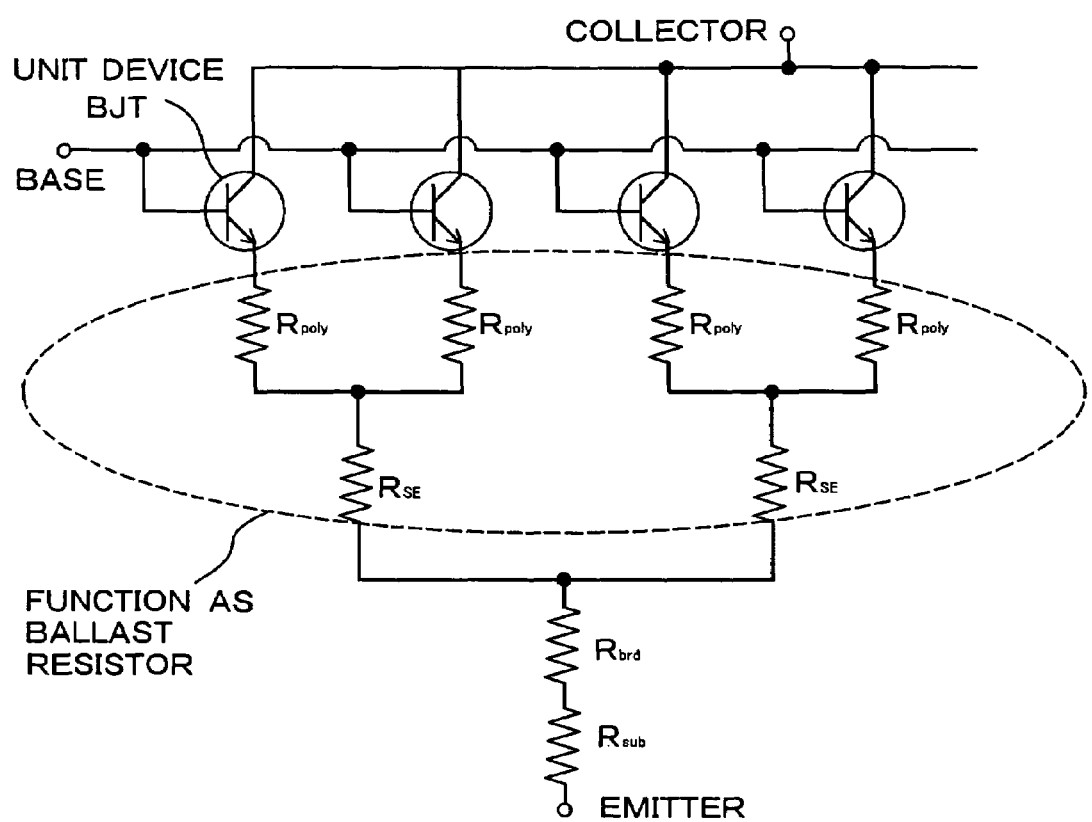
FIG. 19 is an equivalent circuit of a chip in which unit devices in a sub-emitter BJT of a second embodiment are formed to be multi-cell.

An equivalent circuit of the multi-cell devices of the above unit device is shown in FIG. 19. $R_{poly}$ and $R_{SE}$ play a role as ballast resistance to enable a stable operation in multi-cell devices.

As the $R_{poly}$ is determined by an amount of impurity (for example boron) doped to the sub-emitter polysilicon 23, and a length $L_{poly}$ of the sub-emitter polysilicon, a size of the ballast resistance can be freely designed. In this example, it is desired that the sub-emitter finger electrode 211 and the sub-emitter region 232 are horizontally shifted. This is because that by the sub-emitter finger electrode 211 and the sub-emitter region 232 being horizontally shifted, the sub-emitter polysilicon 23 can be expanded horizontally, thereby lengthening a distance where an emitter current flows.

Figure 20:
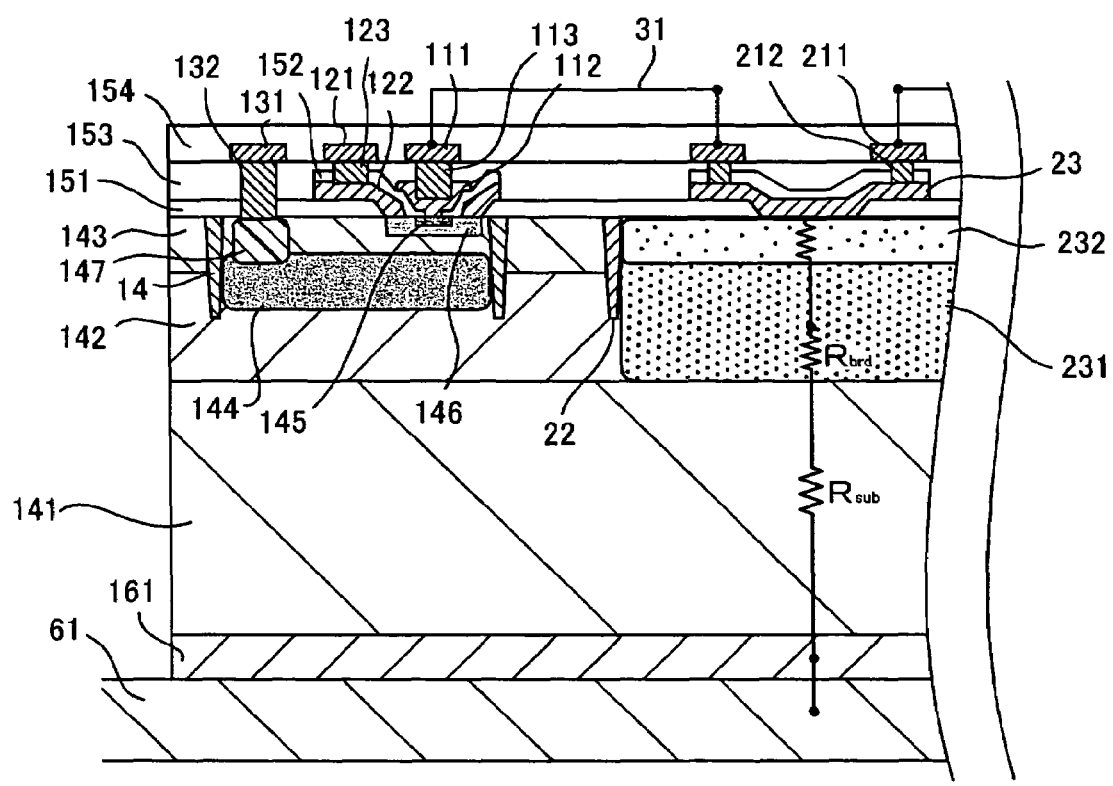
FIG. 20 is a cross-sectional diagram showing a transformed sub-emitter BJT of the second embodiment.
Figure 21:
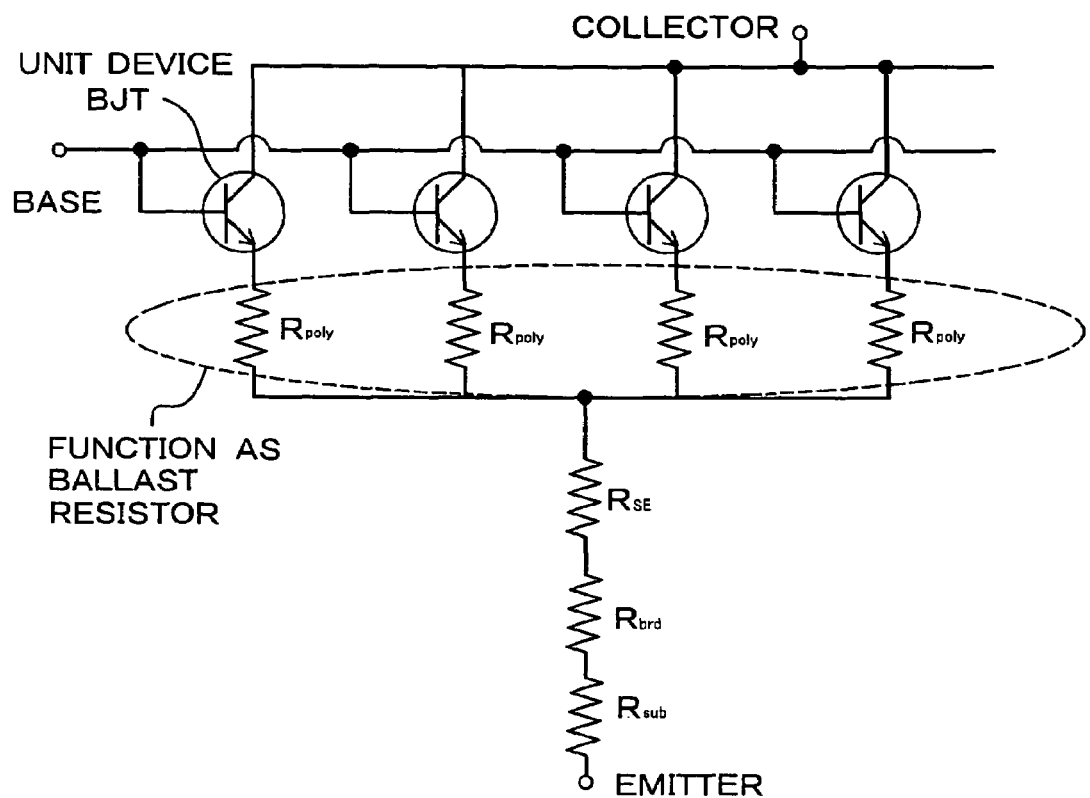
FIG. 21 is an equivalent circuit of a chip in which unit devices in a transformed sub-emitter BJT of a second embodiment are formed to be multi-cell
Figure 22:
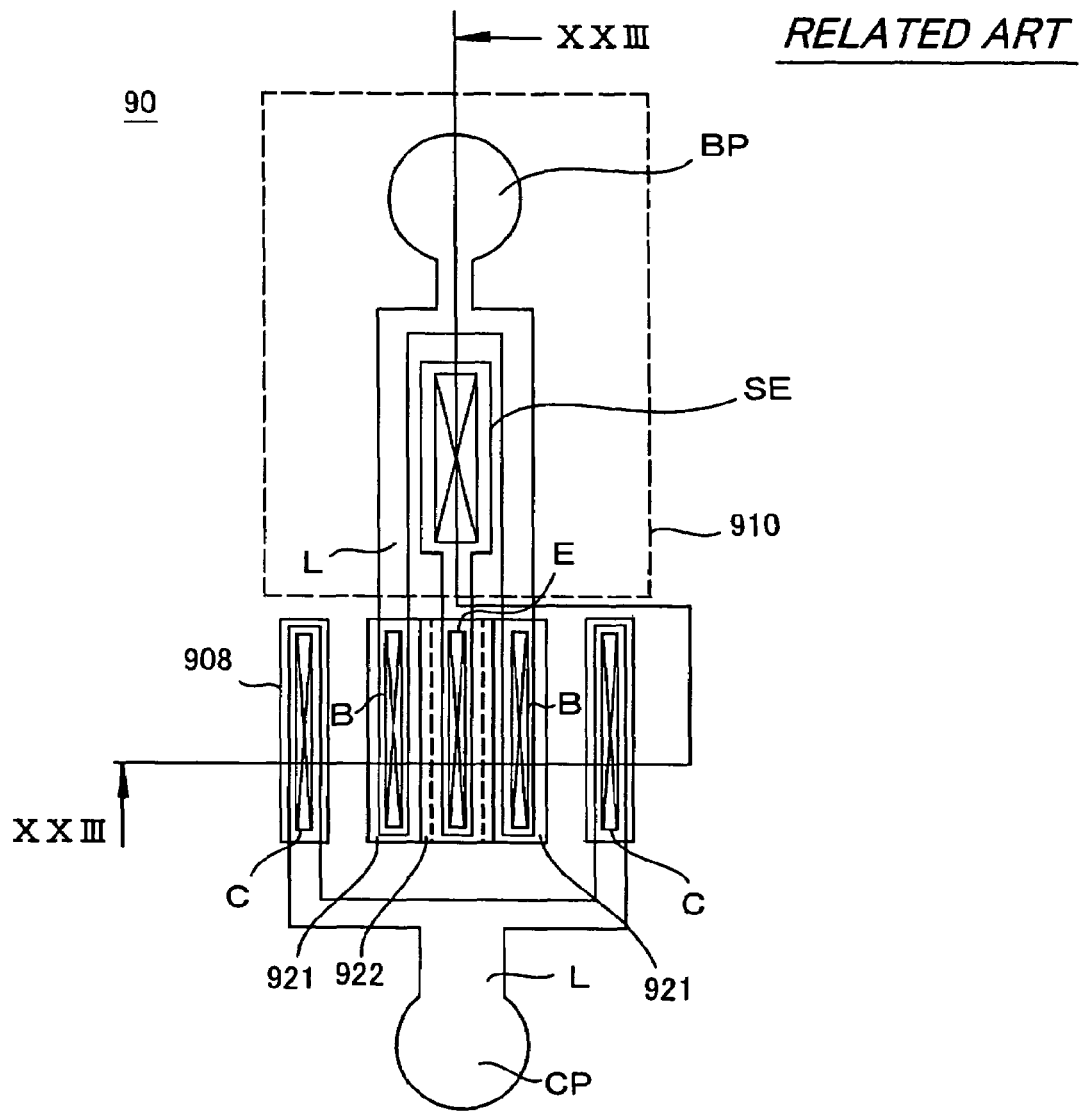
FIG. 22 is a plan layout view showing electrodes and lines of a sub-emitter BJT according to a conventional technique.
Figure 23:
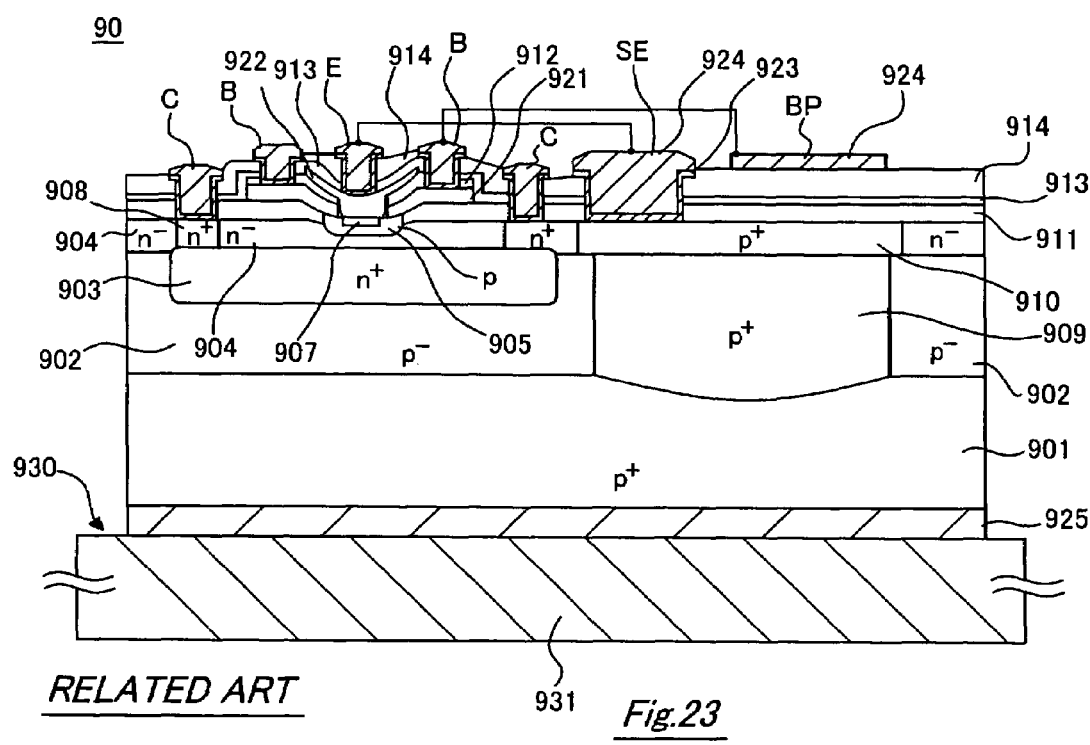
FIG. 23 is a cross-sectional diagram taken along the line XXIII-XXIII of the sub-emitter BJT shown in FIG. 22.

It is not necessary to separate the p type sub-emitter region 232 by each device as shown in FIG. 20. FIG. 21 is an equivalent circuit for devices being formed to be multi-cell. In this case, only the $R_{poly}$ works as a ballast resistor to enable a stable operation in the multi-cell devices.

It is apparent that the present invention is not limited to the above embodiment and it may be modified and changed without departing from the scope and spirit of the invention.

What is claimed is:

1. A semiconductor apparatus, comprising:
    a substrate;
    a plurality of transistor devices formed on the substrate, each transistor device including a control terminal being inputted with a control signal and first and second terminals through which a current flows according to the control signal; and
    a plurality of substrate conductive portions each formed in a region different from a region where the plurality of transistor devices are formed therein, each of the plurality of substrate conductive portions connecting the substrate through a ballast resistor,
    wherein the plurality of transistor devices are connected to the plurality of substrate conductive portions,
    wherein each of the plurality of substrate conductive portions includes a semiconductor layer separated from other substrate conductive portions by a Deep Trench Isolation device, and
    wherein the semiconductor layer has a same conductivity type as the substrate.

2. The semiconductor apparatus according to claim 1, wherein the plurality of substrate conductive portions comprise low resistance layers having resistances lower than the separated semiconductor layer.

3. The semiconductor apparatus according to claim 2, wherein each of the low resistance layers is placed between each of the plurality of substrate conductive portions.

4. The semiconductor apparatus according to claim 3, wherein the separated semiconductor layer is an upper layer with respect to said each of the low resistance layers.

5. The semiconductor apparatus according to claim 4, wherein each of the plurality of substrate conductive portions comprises an electrode portion connected by the first terminal and a conductive layer, and
    wherein each of the separated semiconductor layers contacts the electrode portion.

6. The semiconductor apparatus according to claim 5, wherein the electrode portion comprises a polysilicon layer contacting each of the separated semiconductor layers.

7. The semiconductor apparatus according to claim 6, wherein the electrode portion comprises an external electrode placed on the polysilicon layer, and
    wherein an area at which the external electrode contacts the polysilicon layer is horizontally shifted with respect to an area at which the polysilicon layer contacts said each of said plurality of die substrate conductive portions.

8. The semiconductor apparatus according to claim 7, wherein the semiconductor substrate is connected to ground.

9. The semiconductor apparatus according to claim 7, wherein unit devices as a part of die semiconductor apparatus are multi-cell.

10. The semiconductor device according to claim 1, wherein each of the plurality of substrate conductive portions comprises an electrode portion connected by the first terminal and a conductor layers, and
    wherein each of the separated semiconductor layer contacts the electrode portion.

11. The semiconductor apparatus according to claim 10, wherein the electrode portion comprises a polysilicon layer contacting each of the separated semiconductor layers.

12. The semiconductor apparatus according to claim 11, wherein the electrode portion comprises an external electrode placed on the polysilicon layer, and
    wherein art area at which the external electrode contacts the polysilicon layer is horizontally shifted with respect to an area at which the polysilicon layer contacts said each of said plurality of the substrate conductive portions.

13. The semiconductor apparatus according to claim 1, wherein the semiconductor substrate is connected to ground.

14. The semiconductor apparatus according to claim 1, wherein unit devices as a part of the semiconductor apparatus are multi-cell.

15. The semiconductor apparatus according to claim 1, wherein
said plurality of transistor devices comprise bipolar transistor devices,
    wherein the control terminal, the first terminal, and the second terminal are a base terminal, an emitter terminal, and a collector terminal, respectively, and
    wherein the emitter terminal is connected to the substrate conductive portion.

16. The semiconductor apparatus according to claim 1, wherein said semiconductor layer is other than being in direct contact with said substrate.

17. A semiconductor apparatus comprising:
    a substrate;
    a plurality of transistor devices formed on the substrate, each transistor device including a control terminal being inputted with a control signal and first and second terminals through which a current flows according to the control signal;
    a plurality of substrate conductive portions each formed in a region different from a region where the plurality of transistor devices are formed therein, each of the plurality of substrate conductive portions connecting the substrate through a ballast resistor;
    a plurality of polysilicon layers contacting the substrate conductive portions; and
    external electrodes placed on the polysilicon layers,
    wherein the plurality of transistor devices are connected to the different external electrodes, and
    wherein an area at which the external electrode contacts the polysilicon layer is horizontally shifted with respect to an area at which the polysilicon layer contacts each of said plurality of the substrate conductive portions.

18. The semiconductor apparatus according to claim 17, wherein the semiconductor substrate is connected to ground.

19. The semiconductor apparatus according to claim 17, wherein unit devices as a part of the semiconductor apparatus are multi-cell.

20. The semiconductor apparatus according to claim 17, wherein each of the plurality of substrate conductive portions includes a semiconductor layer separated from other substrate conductive portions by a Deep Trench Isolation device.

* * * * *